US009863061B2

(12) United States Patent
Sudo et al.

(10) Patent No.: US 9,863,061 B2
(45) Date of Patent: Jan. 9, 2018

(54) VITREOUS SILICA CRUCIBLE AND METHOD FOR MANUFACTURING THE SAME

(71) Applicant: SUMCO CORPORATION, Minato-ku, Tokyo (JP)

(72) Inventors: Toshiaki Sudo, Akita (JP); Tadahiro Sato, Akita (JP); Ken Kitahara, Akita (JP); Eriko Kitahara, Akita (JP)

(73) Assignee: SUMCO CORPORATION, Tokyo (JP)

( * ) Notice: Subject to any disclaimer, the term of this patent is extended or adjusted under 35 U.S.C. 154(b) by 16 days.

(21) Appl. No.: 15/103,639

(22) PCT Filed: Dec. 25, 2014

(86) PCT No.: PCT/JP2014/084216
§ 371 (c)(1),
(2) Date: Jun. 10, 2016

(87) PCT Pub. No.: WO2015/099000
PCT Pub. Date: Jul. 2, 2015

(65) Prior Publication Data
US 2016/0289862 A1     Oct. 6, 2016

(30) Foreign Application Priority Data
Dec. 28, 2013  (JP) ................................. 2013-273684

(51) Int. Cl.
*C30B 15/10*   (2006.01)
*C03B 19/09*   (2006.01)
(Continued)

(52) U.S. Cl.
CPC ............ *C30B 15/10* (2013.01); *C03B 19/095* (2013.01); *C30B 29/06* (2013.01); *C30B 35/002* (2013.01); *Y02P 40/57* (2015.11)

(58) Field of Classification Search
CPC ................................. C30B 20/00; C30B 15/10
See application file for complete search history.

(56) References Cited

U.S. PATENT DOCUMENTS

| 2003/0041623 A1 | 3/2003 | Werdecker et al. |
| 2010/0244311 A1 | 9/2010 | Kishi et al. |

(Continued)

FOREIGN PATENT DOCUMENTS

| JP | 2000247778 A | 9/2000 |
| JP | 2003517990 A | 6/2003 |

(Continued)

OTHER PUBLICATIONS

International Search Report (ISR) dated Mar. 31, 2015, issued for International application No. PCT/JP2014/084216.

*Primary Examiner* — Robert M Kunemund
(74) *Attorney, Agent, or Firm* — Law Office of Katsuhiro Arai (57) ABSTRACT

In an embodiment, a vitreous silica crucible 1 includes a cylindrical straight body portion 10a, a corner portion 10c formed at lower end of the straight body portion 10a, and a bottom portion 10b connected with the straight body portion 10a via the corner portion 10c. Moreover, the vitreous silica crucible 1 includes a bubble-containing opaque layer 11 constituting an outer layer, and a bubble-free transparent layer 12 constituting an inner layer. A boundary surface, between the opaque layer 11 and the transparent layer 12 in at least the straight body portion 10a, forms a periodic wave surface in a vertical direction. The vitreous silica crucible can suppress deformation under high temperature.

17 Claims, 6 Drawing Sheets

(51) Int. Cl.
    *C30B 29/06*         (2006.01)
    *C30B 35/00*         (2006.01)

(56) References Cited

U.S. PATENT DOCUMENTS

| | | | |
|---|---|---|---|
| 2010/0251959 A1* | 10/2010 | Kodama | C30B 15/10 117/208 |
| 2010/0314400 A1 | 12/2010 | Kanda | |
| 2012/0160158 A1* | 6/2012 | Sudo | C03B 19/095 117/200 |
| 2012/0160159 A1* | 6/2012 | Sudo | C03B 19/095 117/208 |
| 2012/0318021 A1* | 12/2012 | Sudo | C03B 19/095 65/29.19 |

FOREIGN PATENT DOCUMENTS

| | | |
|---|---|---|
| JP | 2007070221 A | 3/2007 |
| JP | 2013139352 A | 7/2013 |
| WO | 2001046077 A1 | 6/2001 |
| WO | 2009069773 A1 | 6/2009 |
| WO | 2009099084 A1 | 8/2009 |

* cited by examiner

VITREOUS SILICA CRUCIBLE AND METHOD FOR MANUFACTURING THE SAME

This application is the U.S. National Phase under 35 U.S.C. §371 of International Application PCT/JP2014/084216, filed Dec. 25, 2014, which claims priority to Japanese Patent Application No. 2013-273684, filed Dec. 28, 2013. The International Application was published under PCT Article 21(2) in a language other than English.

TECHNICAL

The present invention relates to a vitreous silica crucible and a method for producing the same, and in particular, relates to a vitreous silica crucible for pulling of silicon single crystal and a method for producing the same.

BACKGROUND ART

In the manufacture of silicon single crystal by the Czochralski method (CZ method), a vitreous silica crucible is used. In the CZ method, silicon material is put into the vitreous silica crucible, and thereafter heated and fused. Thereafter, a seed crystal is dipped into the silicon melt, and the seed crystal is gradually pulled while rotating the crucible to grow a single crystal. In order to manufacture high-quality silicon single crystal of for semiconductor devices at low cost, it is necessary to improve the single crystal yield in one pulling process; therefore, a crucible with a stable shape without deformation during a long period of operation becomes necessary.

In deformation of a crucible, the straight body portion of the crucible falling toward the side of silicon melt, which is called inward sagging, becomes a particular problem. Although a heat shield plate which is called a hot zone is provided around the ingot near the liquid surface of the silicon melt, in a case that the straight body portion of the crucible inwardly sags, the inwardly sagging part may contact the heat shield plate. Since the crucible is rotating during the pulling of single crystal, the straight body portion of the crucible comes in contact with the heat shield plate while rotating; thus defects, such as a further deformation of the crucible, damage to the heat shield plate, and reduction of manufacture yield due to a mixing of crucible fragments in the silicon melt, occur.

A method of increasing Al concentration in an outer layer of a crucible to a high viscosity in order to prevent the deformation of the crucible at high temperature (refer to Patent Literature 1), is known. In addition, a method of outwardly widening a straight body portion of a crucible to prevent inward sagging (refer to Patent Literature 2) is also known.

BACKGROUND ART LITERATURE

Patent Literature

Patent Literature 1: Japanese Patent Application Laid-Open No. 2000-247778
Patent Literature 2: International Publication No. 2009/099084

SUMMARY OF THE INVENTION

Problems to Be Solved by the Invention

However, Al is an impurity for the silicon single crystal, and there is a limit for increasing the Al concentration; thus the deformation of the crucible cannot be sufficiently suppressed. In addition, although the crucible with outwardly-widened structure can suppress inward sagging, the adhesion property of the crucible bottom portion and susceptor is insufficient and a buckling or sidewall sagging is likely to occur.

Thus, a purpose of the present invention is to provide a vitreous silica crucible which is capable of suppressing deformation at high temperature, and a method for manufacturing the same.

Means for Solving the Problems

In order to resolve the above problem, the vitreous silica crucible of the present invention including a cylindrical straight body portion, a corner portion formed at bottom end of the straight body portion, and a bottom portion connected with the straight body portion via the corner portion, is characterized in comprising a bubble-containing opaque layer constituting an outer layer of the crucible and a bubble-free transparent layer constituting an inner layer of the crucible, a boundary surface between the opaque layer and the transparent layer of at least the straight body portion forming a periodic wave surface in at least one direction.

According to the present invention, a spatial deviation of remaining stress in the vitreous silica can be reduced since the boundary surface between the opaque layer and the transparent layer has a periodic undulated shape. Therefore, it is possible to reach a condition that deformation of the crucible is unlikely to generate. Therefore, the crucible wall is unlikely to be compressed by pressure from the silicon melt, and deformation of the crucible such as inward sagging of the straight body portion can be suppressed.

In the present invention, it is preferred that a boundary surface between the opaque layer and the transparent layer in the straight body portion and the corner portion forms a wave surface. By this configuration, deformation of the crucible can be further suppressed.

In the present invention, the traveling direction of the wave surface is preferably a vertical direction parallel to a central axis of the straight body portion, and also preferably a circumferential direction of the straight body portion. Further, the traveling direction of the wave surface may be a combination of both the vertical direction and the circumferential direction of the straight body portion. In any case, since the boundary surface between the opaque layer and the transparent layer is indicated as a change of a striped pattern, deformation of the crucible under high temperature can be suppressed.

In the present invention, a period of change in the wave surface is preferably 20 mm or more and 100 mm or less. When the period of change in the wave surface is within this range, a suitable wavelength can be provided with respect to an amplitude of a wave type, to impart a wave-type structure with high mechanical strength.

Moreover, the method for manufacturing a vitreous silica crucible according to the present invention, wherein the vitreous silica crucible includes a cylindrical straight body portion having an opening portion at the top end, a corner portion formed at the bottom end of the straight body portion, and a bottom portion connected to the straight body portion via the corner portion, is characterized in comprising a process of depositing a quartz powder on an inner surface of a mold while rotating the mold which has a shape coinciding with the outer shape of the vitreous silica crucible, and a process of vitrifying the quartz powder by arc melting to form the vitreous silica crucible, wherein in the process of arc melting the quartz powder, sucking force during deaerating through a ventilation hole provided in the mold is changed periodically along one direction, and a boundary surface between the opaque layer and the transparent layer in at least the straight body portion is formed as a periodic wave surface in the one direction.

According to the present invention, the boundary surface between the opaque layer and the transparent layer has a periodic undulated shape in one direction, so that a vitreous silica crucible which is unlikely to generate deformation under high temperature can be manufactured.

Effects of the Invention

According to the present invention, it is possible to provide a vitreous silica crucible which is capable of suppressing deformation under high temperature, and a method for manufacturing the same.

MODE FOR CARRYING OUT THE INVENTION

Hereinafter, with reference to the attached drawings, preferred embodiments of the present invention will be explained.

Figure 1:
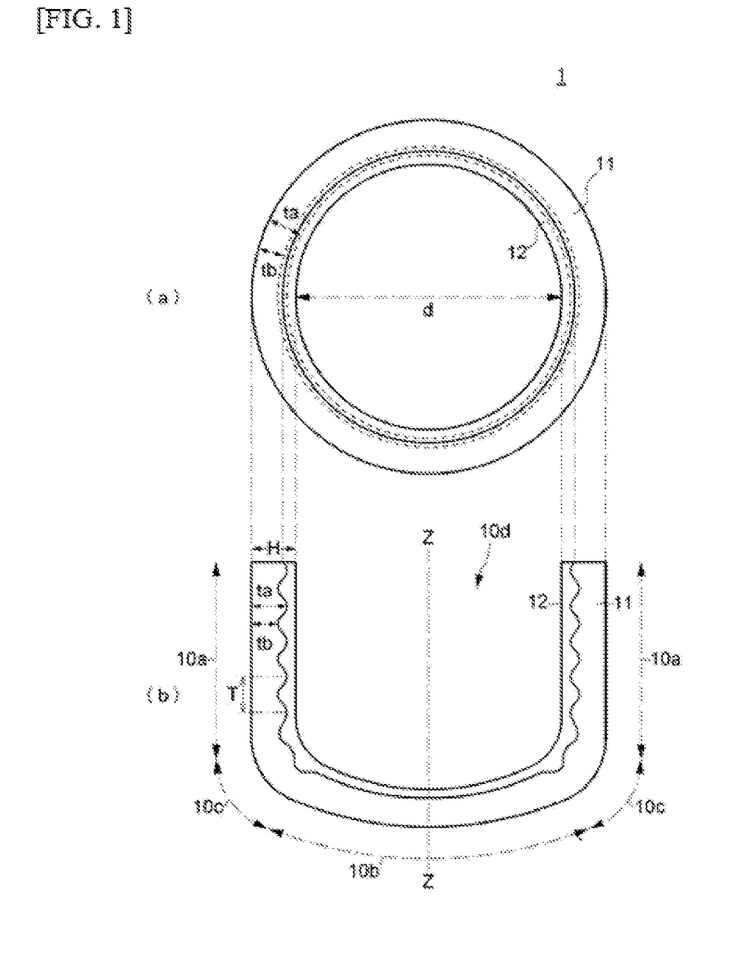
FIG. 1 is a schematic sectional view illustrating a structure of a vitreous silica crucible according to a first embodiment of the present invention.

FIG. 1 is a schematic sectional view illustrating a structure of a vitreous silica crucible according to a first embodiment of the present invention. Moreover, FIG. 2 is a schematic perspective view showing a three-dimensional structure of the vitreous silica crucible of FIG. 1.

Figure 2:
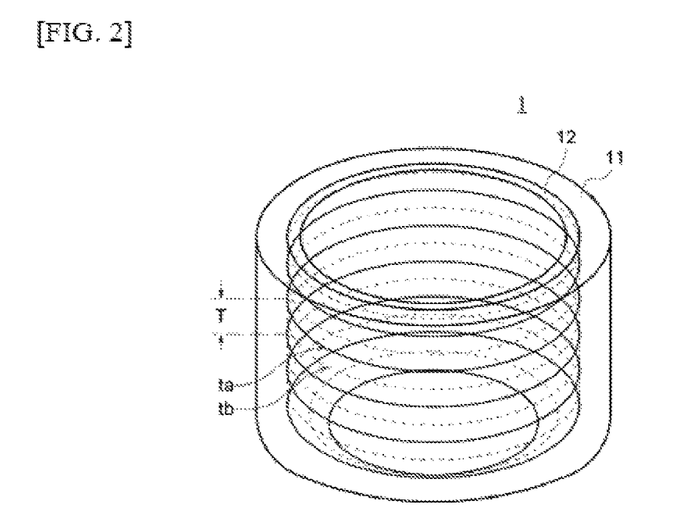
FIG. 2 is a schematic perspective view showing a three-dimensional structure of the vitreous silica crucible of FIG. 1.

As shown in FIG. 1 and FIG. 2, a vitreous silica crucible 1 according to the present embodiment includes a cylindrical straight body portion 10a having an opening portion 10d at top end, a corner portion 10c formed at lower end of the straight body portion 10a, and a bottom portion 10b connected with the straight body portion 10a via the corner portion 10c.

The straight body portion 10a extends upward straightly from the top end of the corner portion 10c, but it may not be perfectly vertical, and may be an outwardly-widened shape inclining to be gradually wider upwardly. Furthermore, the straight body portion 10a may be linear or gradually curved. The bottom portion 10b is a round bottom consisting of a curved surface, but may also be a flat bottom consisting of a flat surface. The curvature (second curvature) of the corner portion 10c connecting the straight body portion 10a with the bottom portion 10b is larger than the curvature (first curvature) of the bottom portion 10b.

The diameter (opening diameter) of the opening portion 10d is preferably 32 inches (about 800 mm) or more. This is because that such a crucible with a large opening diameter is used for pulling a silicon single crystal ingot with a large outer diameter of 300 mm or more, and thus, it is required that deformation do not easily occur for a long period of time during a pulling process. If the straight body portion with an opening diameter of 32 inches sags about 30 mm inwardly, the inwardly sagging part may contact the heat shield plate which would result in a failure of pulling of silicon single crystal. In some cases, high-temperature silicon melt might leak, which would lead to an explosion. If pulling of silicon single crystal fails, recovery of the crucible and the melt is necessary. Also, in the furnace, particularly the repair of the heat shield plate would be necessary.

The wall thickness of the crucible is preferred to be 10 mm or more, and more preferred to be 13 mm or more. Usually, the wall thickness of a large-size crucible having an opening diameter of 32 inches (about 800 mm) or more is 10 mm or more, and the wall thickness of a large-size crucible having an opening diameter of 40 inches (about 1000 mm) is 13 mm or more. Therefore, a sufficient thickness for these large-size and large-volume crucibles, to not be deformed by the pressure of silicon melt, is required.

As shown in FIG. 1, the vitreous silica crucible 1 has a two-layer structure, and includes an opaque layer 11 constituting the outer layer and a transparent layer 12 constituting the inner layer. The opaque layer 11 and the transparent layer 12 are both disposed entirely from the straight body portion 10a to the bottom portion 10b of the crucible.

The opaque layer 11 is a vitreous silica layer that appears to be clouded by encompassing a large number of microbubbles. The opaque layer 11 has a function of uniformly conducting heat from a heater provided on the outer periphery of the crucible to the silicon melt in the crucible during the pulling of silicon single crystal. The opaque layer 11 has higher heat capacity than the transparent layer 12, and thus the silicon melt temperature can be controlled stably.

The bubble content rate of the opaque layer 11 is higher than that of the transparent layer 12, and is not in particularly limited as long as the function is exhibited, and is preferred to be more than 0.1% and 5.0% or less. That is because when the bubble content rate of the opaque layer 11 is 0.1% or less, the function of the opaque layer 11 is not exhibited, and the heat retention is insufficient. Moreover, when the bubble content rate of the opaque layer 11 is more than 5.0%, the probability of deformation of the crucible due to expansion of the bubbles increases, the single crystallization yield may be reduced, and also the heat conductivity becomes insufficient. The bubble content rate of the opaque layer 11 is particularly preferable to be 1.0% or more and 4.0% or less. If it is 1.0% or more and 4.0% or less, deformation of the crucible can be further avoided, and heat conductivity can be further improved.

The bubble content rate of the vitreous silica can be determined by specific gravity measurement. A vitreous silica piece having a unit volume (1 cm$^3$) is cut out from the crucible. When the mass is A, and the specific gravity for vitreous silica not containing bubbles is assumed to be B=2.21 g/cm$^3$, the bubble content rate P (%) is P=(1−AB)*100.

The opaque layer 11 is preferred to be made of natural quartz. Natural quartz means natural material such as natural quartz crystal, silica stone, and so on. In general, natural quartz contains metal impurities at higher concentrations and OH groups at lower concentrations than does synthetic silica. For example, natural quartz contains 1 ppm or more of Al, 0.05 ppm or more of each of alkali metals (Na, K and Li), and less than 60 ppm of OH group. Further, it is possible to judge whether quarts is natural quartz or not by considering a plurality of factors comprehensively. Natural quartz has higher viscosity at high temperature than does synthetic silica, and thus enhances the high-temperature strength of the entire crucible. In addition, natural quartz is cheaper than synthetic silica, and thus is advantageous in terms of cost.

The transparent layer 12 is a bubble-free vitreous silica layer that appears to be transparent at a glance. Due to the transparent layer 12, detachment of quartz pieces from the inner surface of the crucible can be prevented, and thus silicon single crystallization yield can be enhanced. The transparent layer 12 may have a bubble content rate and a bubble size such that the single crystallization yield is at least not deteriorated due to the bubbles. Although without particular limit, the bubble content rate is 0.1% or less and the average diameter of the bubbles is 100 μm or less.

The change of the bubble content rate from the opaque layer 11 to the transparent layer 12 is relatively abrupt. At a position of tens of μm from a position where the bubble content rate of the transparent layer 12 starts to increase toward the outer surface side of the crucible, the bubble content rate reaches that of the opaque vitreous silica layer 11. Therefore, the boundary between the opaque layer 11 and the transparent layer 12 is visually definite.

The transparent layer 12 is preferred to be made of synthetic silica. Synthetic silica is silica material synthesized, for example, by hydrolysis of silicon alkoxide. In general, synthetic silica contains metal impurities at lower concentrations and OH groups at higher concentrations than does natural quartz. For example, for synthetic silica, the content of each element of metal impurities is less than 0.05 ppm, and the OH group content is 30 ppm or more. However, it should be noted that because synthetic silica with metal impurities such as Al added is known, it is difficult to determined whether it is synthetic silica or not based on a single factor, but it can be comprehensively determined based on a plurality of factors. Synthetic silica contains impurities in lower concentrations than does natural quartz, and thus the increase of impurities released into silicon melt from the crucible can be prevented, and the silicon single crystallization yield can be enhanced.

The thickness of the transparent layer 12 is preferred to be 0.5 mm or more. When the transparent layer 12 is thinner than 0.5 mm, there is a risk that the transparent layer 12 may erode and the opaque layer 11 may be exposed during the pulling of silicon single crystal. The wall thickness of the crucible is a sum of the opaque layer 11 and the transparent layer 12, and the thickness of the opaque layer 11 is a value obtained by subtracting the thickness of the transparent layer 12 from the wall thickness of the crucible. Therefore, when the opaque layer 11 becomes thinner, the transparent layer 12 becomes thicker, and when the opaque layer 11 becomes thicker, the transparent layer 12 becomes thinner.

In the present embodiment, the boundary surface between the opaque layer 11 and the transparent layer 12 is formed as a periodic wave surface in one direction. The traveling direction of the wave surface is a vertical direction parallel to the central axis Z of the cylindrical shape of the straight body portion 10a. In order to realize such shape of boundary surface, in the straight body portion 10a and the corner portion 10c of the crucible, a thick region and thin region of the opaque layer 11 are provided repeatedly at a predetermined period in one direction. The thickness of the opaque layer 11 is constant in the circumferential direction, thus a thickness change pattern of stripes as shown in FIG. 2 can be observed three-dimensionally. In FIG. 2, the continuous line is the thickest region of the opaque layer 11, and the dashed line is the thinnest region of the opaque layer 11, respectively.

With respect to the wall thickness H of the straight body portion 10a of the vitreous silica crucible 1, the thickness of the opaque layer 11 is 0.8 H at the thickest region (maximum thickness ta), and is 0.2 H at the thinnest region (minimum thickness tb). For example, when the straight body portion 10a has a wall thickness H=10 mm, the opaque layer 11 has a maximum thickness ta of 8 mm, and a minimum thickness tb of 2 mm. Such maximum thickness ta and minimum thickness tb are repeated periodically in an axial direction (vertical direction).

The period T of change in the wave surface is preferably 20 mm or more and 100 mm or less. In addition, the number of the waves is preferably 8-32. In consideration of bubble size, a period T less than 20 mm is too short to obtain a clear waveform, and a period T more than 100 mm is too long to reduce the burden of the crucible and also a clear waveform is difficult to obtain.

The boundary surface of wave type is necessary to be provided to the entire circumference of at least the straight body portion 10a, and preferably provided to both of the straight body portion 10a and the corner portion 10c. The boundary surface of wave type is not necessarily provided to the bottom portion 10b, and the bottom portion 10b may be a flat boundary surface. However, the boundary surface of wave type may be disposed on the entire crucible including the straight body portion 10a, the corner portion 10c, and the bottom portion 10b.

In the pulling process of silicon single crystal, the vitreous silica crucible 1 is heated and softened, and is likely to be deformed by its own weight and pressure from the silicon melt. In particular, the softening degree of the lower portion is greater than that of the melt surface of the silicon melt. Furthermore, the pressure which the inner peripheral surface receives from the silicon melt in the vitreous silica crucible 1 is very high; especially the wall body of the straight body portion 10a of the crucible is compressed by pressure from the silicon melt, which results in a condition that the upper end portion of the crucible above the melt surface of the silicon melt is likely to inwardly sag. However, in the case of the boundary surface between the opaque layer 11 and the transparent layer 12 having a periodic undulated shape in the vertical direction, the wall body of the crucible is unlikely to be compressed by the pressure from the silicon melt, and thus a condition that inward sagging is unlikely to generate can be obtained. In addition, a spatial deviation of the remaining stress in the vitreous silica can be reduced, and deformation of the crucible under high temperature can be suppressed.

Such boundary surface of wave shape can be realized by changing the sucking force from the ventilation hole for evacuation of the graphite mold used in the manufacture, to match the thickness of the opaque layer 11. That is, a region desired to form a thick opaque layer 11 is sucked strongly (more), a region desired to form a thin opaque layer 11 is sucked weakly (less), and such strong/weak suction may be for instance a periodic layout in the vertical direction. A thus-manufactured crucible has the boundary surface of wave shape as described above; therefore inward sagging of the crucible can be suppressed.

Figure 3:
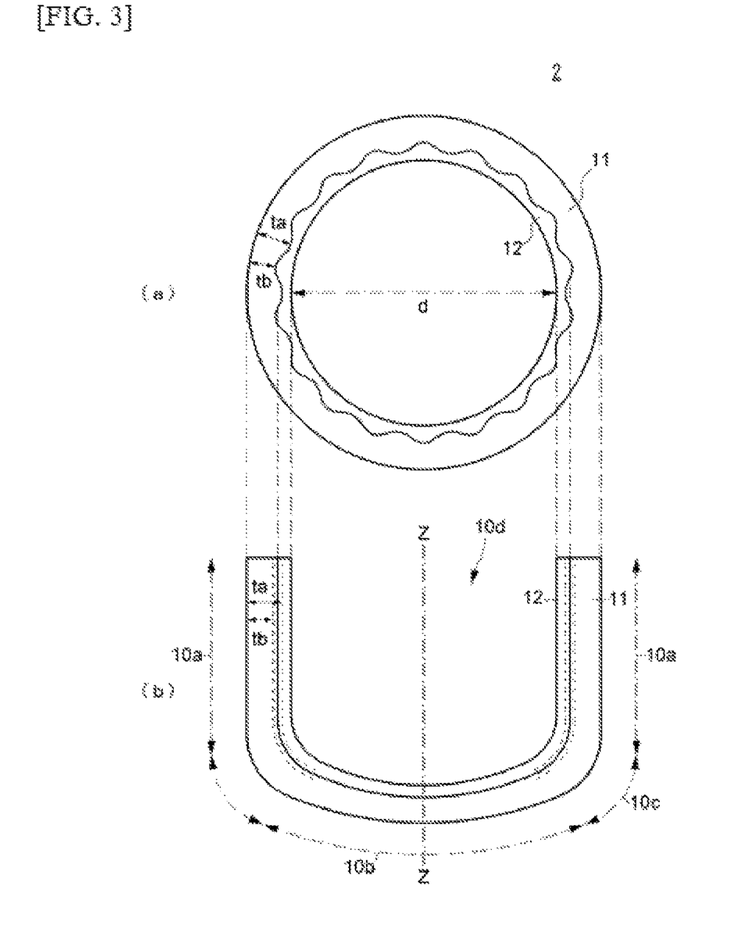
FIG. 3 is a schematic sectional view illustrating a structure of a vitreous silica crucible according to a second embodiment of the present invention.

FIG. 3 is a schematic sectional view illustrating a structure of a vitreous silica crucible 2 according to a second embodiment of the present invention. Moreover, FIG. 4 is a schematic perspective view showing a three-dimensional structure of the vitreous silica crucible 2 of FIG. 3.

Figure 4:
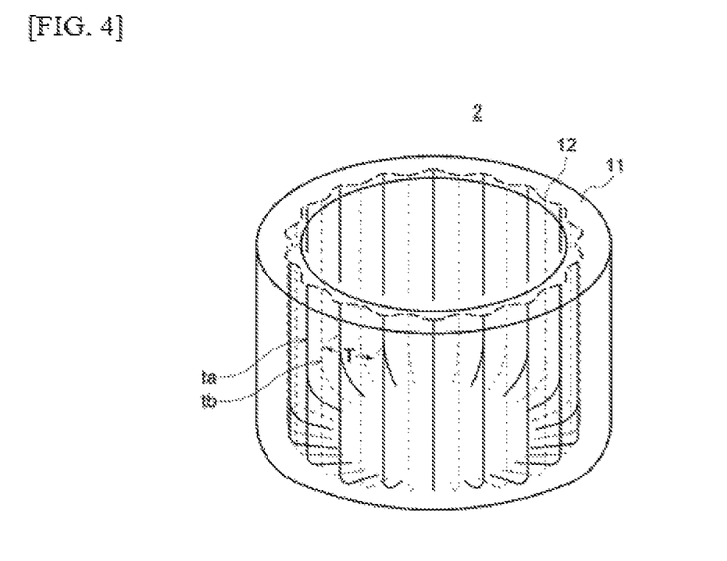
FIG. 4 is a schematic perspective view showing a three-dimensional structure of the vitreous silica crucible of FIG. 3.

As shown in FIG. 3 and FIG. 4, a vitreous silica crucible 2 according to the present embodiment is characterized in that the boundary surface between the opaque layer 11 and the transparent layer 12 is formed as a periodic wave surface in one direction, and the traveling direction of the wave surface is the circumferential direction of the straight body portion 10a. In order to realize such shape of boundary surface, in the vitreous silica crucible, in the straight body portion 10a and the corner portion 10c of the crucible, a thick region and thin region of the opaque layer 11 are provided repeatedly at a predetermined period in the circumferential direction. The thickness of the opaque layer 11 is constant in the vertical direction, thus a thickness change pattern of vertical stripes as shown in FIG. 4 can be observed three-dimensionally.

Like the first embodiment, with respect to the wall thickness H of the straight body portion of the vitreous silica crucible 2, the thickness of the opaque layer 11 is 0.8 H at the thickest region, and is 0.2 H at the thinnest region. When the straight body portion has a wall thickness H=10 mm, the opaque layer 11 has a maximum thickness of 8 mm, and a minimum thickness of 2 mm. Such maximum thickness and minimum thickness are repeated periodically in the circumferential direction. Such opaque layer 11 of wave type may be formed in at least the straight body portion, in the corner portion 10c and the bottom portion 10b may not be wave type or may be wave type.

The period T of change in the wave surface is preferably 20 mm or more and 100 mm or less. In addition, the number of the waves is preferably 32-128. In consideration of bubble size, a period T less than 20 mm is too short to obtain a clear waveform, and a period T more than 100 mm is too long to reduce the burden of the crucible and also a clear waveform cannot be obtained.

In the present embodiment, the boundary surface of wave type is necessary to be provided to the entire circumference of at least the straight body portion 10a, and preferably provided to both of the straight body portion 10a and the corner portion 10c. The boundary surface of wave type is not necessarily provided to the bottom portion 10b, and the bottom portion 10*may* be a flat boundary surface. However, the boundary surface of wave type may be disposed on the entire crucible including the straight body portion 10a, the corner portion 10c, and the bottom portion 10b.

The vitreous silica crucible 2 according to the present embodiment, can exhibit the same effect as embodiment 1. That is, in the case of the boundary surface between the opaque layer 11 and the transparent layer 12 having a periodic undulated shape in circumferential direction, the wall body of the crucible is unlikely to be compressed by the pressure from the silicon melt; thus a condition that inward sagging is unlikely to generate can be obtained.

Figure 5:
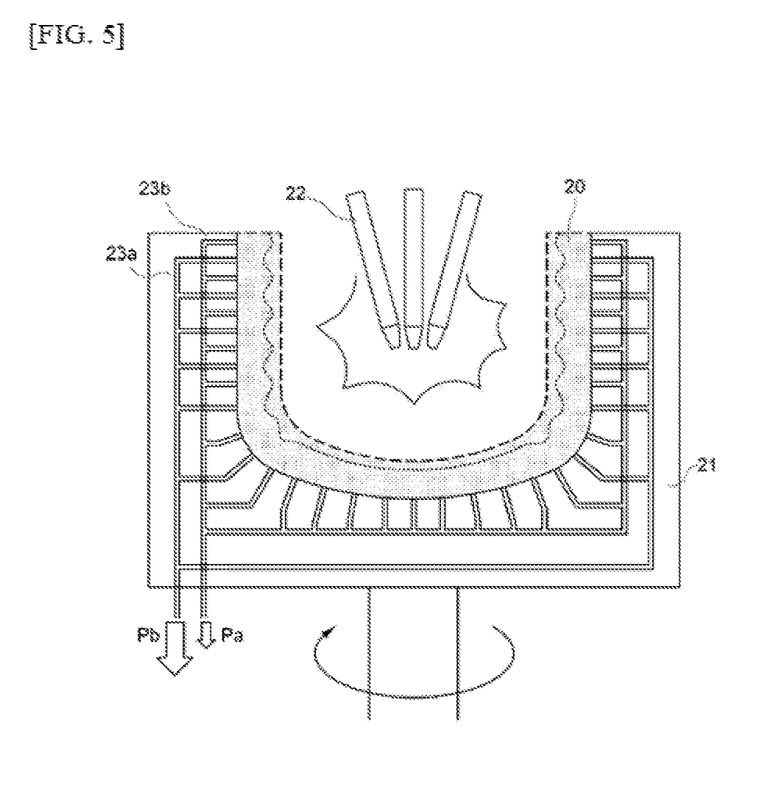
FIG. 5 is a schematic view illustrating a method of manufacturing a vitreous silica crucible 1.

FIG. 5 is a schematic view illustrating a method of manufacturing a vitreous silica crucible 1.

According to the present embodiment, the vitreous silica crucible 1 can be manufactured by the rotating mold method. In the rotating mold method, quartz powder 20 is deposited to a predetermined thickness on the inner surface of the graphite mold 21 rotating at certain speed. Since the mold 21 is rotating, the quartz powder 20 filled in the mold 21 is retained at a specific position at the inner wall surface by the centrifugal force, and the shape is maintained. It is preferred to use 2 types including natural quartz powder and synthetic silica powder, as the quartz powder 20. That is, the natural quartz powder is first deposited to a predetermined thickness; the synthetic silica is then deposited on the inner surface of the deposition layer of the natural quartz powder to a predetermined thickness (step S12).

Thereafter, arc electrodes 22 are placed in the mold 21, and the quartz powder is heated to 1700 deg. C. or more to fuse by arc discharging from the inside of the layer of quartz powder 20. Specific conditions such as heating time, heating temperature, etc. can be appropriately determined in consideration of conditions such as the raw material and the size of the crucible.

Furthermore, while heating, depressurization is conducted from the mold side 21, then gas inside the fused quartz is sucked to the outside through vents 23a, 23b provided on the mold 21, and discharged to the outside through the vents 23a, 23b; thus the bubbles in the crucible inner surface are partially removed, and a substantially bubble-free transparent layer 12 is formed. At this time, at a region desired to form a thin transparent layer 12 (a thick opaque layer 11), gas is sucked weakly through the vents 23b as shown by the small arrow Pa, at a region desired to form a thick transparent layer 12 (a thin opaque layer 11), gas is sucked strongly through the vents 23a as shown by the larger arrow Pb, and the strong/weak suction force distribution may be a periodic layout in the vertical direction. Thereafter, the sucking force of all the ventilation holes 23a, 23b is weakened (or stopped), by further continuing heating and leaving bubbles, an opaque layer 11 containing a large number of micro bubbles is formed. As described above, the vitreous silica crucible 1 which has an opaque layer 11 made of natural vitreous silica containing a large number of bubbles and a transparent layer 12 made of bubble-free synthetic silica, is completed.

FIG. 5 shows a method for manufacturing the vitreous silica crucible according to the first embodiment shown in FIG. 1 and FIG. 2, and the strong sucking force region and the weak sucking force region are arranged alternately along the vertical direction of the crucible, but in the case of the strong sucking force region and the weak sucking force region being arranged alternately along the circumferential direction of the crucible, the vitreous silica crucible according to the second embodiment shown in FIG. 3 and FIG. 4 can be manufactured.

As described above, the method of manufacturing a vitreous silica crucible according to the present embodiment, can change the thickness of the opaque layer 11 periodically, because the sucking force during deaerating (degassing) the melting vitreous silica through the ventilation holes 23 provided on the graphite mold 21, is changed periodically along the vertical direction or the circumferential direction of the crucible. Therefore, a vitreous silica crucible which is difficult to deform under high temperature during pulling of silicon single crystal can be manufactured.

As mentioned above, the preferred embodiments of the present invention have been described. The present invention is not in particularly limited to the above-mentioned embodiments, and various modifications are possible as long as the modification does not depart from the spirit of the present invention, and it is needless to say that those modifications are within the scope of the present invention.

For example, in the above embodiment, it has been described that the thickness of the opaque layer 11 is changed periodically in one direction of either vertical direction or circumferential direction, but it also may be changed periodically in both directions of vertical direction and circumferential direction.

EXAMPLES

Heat resistance test simulations of samples of 32-inch vitreous silica crucibles (CAE: computer aided engineering)

were performed. In these simulations, crucibles in which the thickness of the opaque layer 11 was changed in the vertical direction shown in FIG. 1 and FIG. 2 were used, and 10 types of crucible samples #1-#10 with different periods T of the thickness of the opaque layer 11 were prepared. The change periods T of the thickness of the opaque layer 11 in the samples #1-#10, were 10, 20, 30, 40, 60, 80, 100, 120, 140, and 200 mm, respectively. Moreover, the wall thickness of the straight body portion was 10 mm, the maximum thickness of the opaque layer 11 was 8 mm, and the minimum thickness of the opaque layer was 2 mm.

Figure 6:
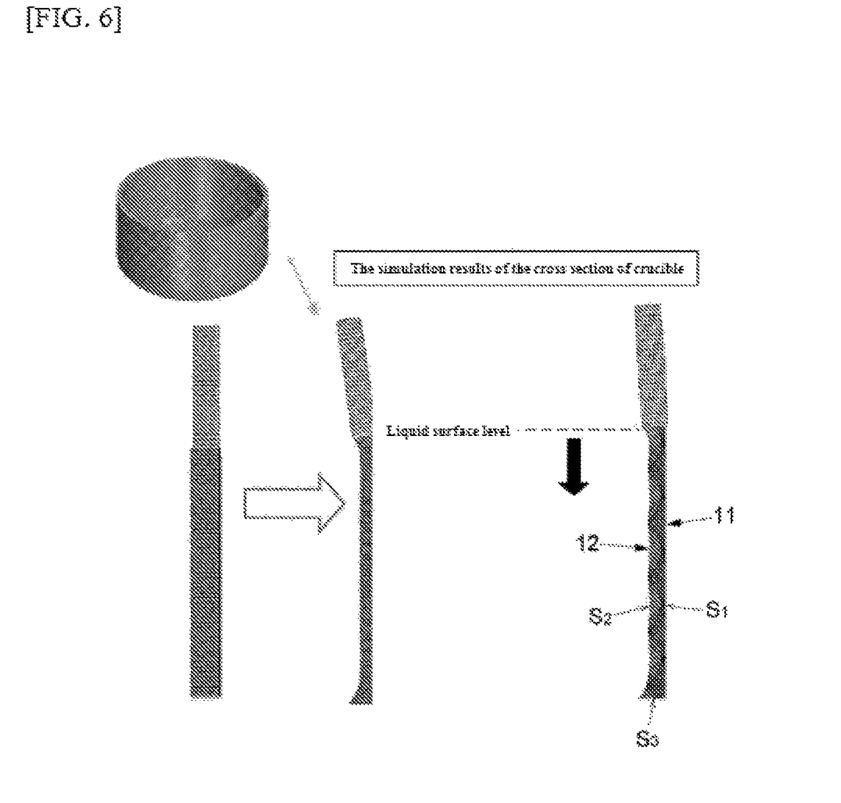
FIG. 6 is a figure explaining simulation conditions, particularly showing a state of a crucible wall after simulation.

Here, the mass density of the crucible wall was 2.328 $e^3$ [kg/m$^3$], and the Poisson's ratio was 0.28. Also, the Young's modulus of the upper part of the crucible that does not contact the silicon melt was 130 [Gpa], and the Young's modulus of the inner layer of the crucible that contacts the silicon melt (the transparent layer 12), and the outer layer (the opaque layer 11) was 65 [Gpa] and 97.5 [Gpa], respectively. In addition, as a boundary condition, the inner surface of the crucible $S_2$ which contacts the silicon melt was assumed to be under pressure of 1 [Mpa]. Moreover, since the outer surface of the crucible $S_1$ contacts the inner surface of the susceptor, position in the X direction (horizontal direction) was assumed to be restrained. Furthermore, the entire lower end of the crucible wall $S_3$ was also assumed to be restrained.

FIG. 6 shows results of the deformation test simulation with or without the wave surface regarding the cross section of the straight body portion from the open top end of the vitreous silica crucible. The result of the deformation test simulation without the wave surface shows that the upper portion of the crucible wall which contacts the silicon melt had extensive inward sagging, and therefore, there is a risk that this inwardly sagging part might contact the heat shield plate, while the result of the deformation test simulation with the wave surface shows that the upper portion of the crucible wall which does not contact the silicon melt had little inward sagging, and therefore, there is no risk of this inwardly sagging part contacting the heat shield plate.

Table 1 is a table showing the results of deformation test simulation performed on the crucible samples #1 to #10 under the conditions described above. It should be noted that the heating conditions were 48 hours at 1,500 degrees.

22 arc electrode
23 ventilation hole
32 opening diameter
H wall thickness
T period
ta maximum thickness
tb minimum thickness

What is claimed is:

1. A vitreous silica crucible, including a cylindrical straight body portion, a corner portion formed at bottom end of the straight body portion, and a bottom portion connected with the straight body portion via the corner portion, is characterized in comprising:
 a bubble-containing opaque layer constituting an outer layer of the crucible, and a bubble-free transparent layer constituting an inner layer of the crucible,
 a boundary surface between the opaque layer and the transparent layer of at least the straight body portion forming a periodic wave surface in at least one direction.

2. The vitreous silica crucible according to claim 1, wherein the boundary surface between the opaque layer and the transparent layer in the straight body portion and the corner portion forms the wave surface.

3. The vitreous silica crucible according to claim 1, wherein a traveling direction of the wave surface is a vertical direction of the straight body portion.

4. The vitreous silica crucible according to claim 1, wherein a traveling direction of the wave surface is a circumferential direction of the straight body portion.

5. The vitreous silica crucible according to claim 1, wherein a traveling direction of the wave surface is a combination of both a vertical direction and a circumferential direction of the straight body portion.

6. The vitreous silica crucible according to claim 1, wherein a change period of the wave surface is 20 mm or more and 100 mm or less.

7. A method for manufacturing a vitreous silica crucible, wherein the vitreous silica crucible includes a cylindrical straight body portion having an opening portion at a top end, a corner portion formed at a bottom end of the straight body portion, a bottom portion connected with the straight body portion via the corner portion, comprises:

TABLE 1

|  | #1 | #2 | #3 | #4 | #5 | #6 | #7 | #8 | #9 | #10 |
|---|---|---|---|---|---|---|---|---|---|---|
| Period T (mm) | 10 | 20 | 30 | 40 | 60 | 80 | 100 | 120 | 140 | 200 |
| Result | no deformation | no deformation | no deformation | no deformation | no deformation | no deformation | no deformation | deformation | deformation | Deformation |

As can be seen from Table 1, deformation occurred in samples #1, #8-#10, but did not occur in samples #2-#7.

DESCRIPTION OF THE SYMBOLS 1, 2 vitreous silica crucible
10a straight body portion
10b bottom portion
10c corner portion
10d opening portion
11 opaque layer
12 transparent layer
20 quartz powder
21 graphite mold a process of depositing a quartz powder on an inner surface of a mold which has a shape coinciding with the outer shape of the vitreous silica crucible while rotating the mold, and
 a process of vitrifying the quartz powder by arc melting to form the vitreous silica crucible,
 wherein in the process of arc melting the quartz powder, sucking force during deaerating through ventilation holes provided on the mold is changed periodically along one direction, and a boundary surface between the opaque layer and the transparent layer in at least the straight body portion is formed as a periodic wave surface in the one direction.

8. The vitreous silica crucible according to claim 2, wherein a traveling direction of the wave surface is a vertical direction of the straight body portion.

9. The vitreous silica crucible according to claim 2, wherein a traveling direction of the wave surface is a circumferential direction of the straight body portion.

10. The vitreous silica crucible according to claim 2, wherein a traveling direction of the wave surface is a combination of both a vertical direction and a circumferential direction of the straight body portion.

11. The vitreous silica crucible according to claim 2, wherein a change period of the wave surface is 20 mm or more and 100 mm or less.

12. The vitreous silica crucible according to claim 3, wherein a change period of the wave surface is 20 mm or more and 100 mm or less.

13. The vitreous silica crucible according to claim 4, wherein a change period of the wave surface is 20 mm or more and 100 mm or less.

14. The vitreous silica crucible according to claim 5, wherein a change period of the wave surface is 20 mm or more and 100 mm or less.

15. The vitreous silica crucible according to claim 8, wherein a change period of the wave surface is 20 mm or more and 100 mm or less.

16. The vitreous silica crucible according to claim 9, wherein a change period of the wave surface is 20 mm or more and 100 mm or less.

17. The vitreous silica crucible according to claim 10, wherein a change period of the wave surface is 20 mm or more and 100 mm or less.

\* \* \* \* \*